United States Patent [19]

Taneya et al.

[11] Patent Number: 5,182,758
[45] Date of Patent: Jan. 26, 1993

[54] PERIODIC GAIN-TYPE SEMICONDUCTOR LASER DEVICE

[75] Inventors: Mototaka Taneya; Fumihiro Konushi, both of Nara; Toshiyuki Okumura, Tenri; Haruhisa Takiguchi, Nara, all of Japan

[73] Assignee: Sharp Kabushiki Kaisha, Osaka, Japan

[21] Appl. No.: 802,118

[22] Filed: Dec. 4, 1991

[30] Foreign Application Priority Data

Dec. 4, 1990 [JP] Japan .................................. 2-400341

[51] Int. Cl.⁵ .............................................. H01S 3/19
[52] U.S. Cl. ...................................... 372/46; 372/48; 372/96
[58] Field of Search .................... 372/45, 46, 48, 96

[56] References Cited

U.S. PATENT DOCUMENTS

| 4,719,633 | 1/1988 | Yoshikawa et al. | 372/46 |
| 4,737,961 | 4/1988 | Mori et al. | 372/46 |

FOREIGN PATENT DOCUMENTS

| 61-183987 | 8/1986 | Japan . | |
| 64-21986 | 1/1989 | Japan . | |
| 0268482 | 11/1990 | Japan | 372/46 |
| 0012981 | 1/1991 | Japan | 372/46 |

OTHER PUBLICATIONS

Wei Hsin et al., *International Electron Devices Meeting* (Dec. 1987) pp. 792-795.

Primary Examiner—Georgia Y. Epps
Attorney, Agent, or Firm—Morrison & Foerster

[57] ABSTRACT

A periodic gain-type semiconductor laser device in which a mesa stripe has wide portions and narrow portions alternately arranged with a period that is an integral multiple of the half-wavelength of the emitted light. A multilayer structure including an n-AlGaAs first cladding layer 103 and an AlGaAs non-doped active layer 104 formed on the mesa stripe also have wide portions and narrow portions. An n-AlGaAs current confining layer 106 covers the sides of the AlGaAs non-doped active layer 104. The height of the top surface of the n-AlGaAs current confining layer 106 matches the height of the AlGaAs non-doped active layer 104. A p-AlGaAs second cladding layer 105 is formed on the AlGaAs non-doped active layer 104 and the current confining layer 106. A driving current is not injected into the narrow portions of the AlGaAs non-doped active layer 104.

5 Claims, 7 Drawing Sheets

PERIODIC GAIN-TYPE SEMICONDUCTOR LASER DEVICE

BACKGROUND OF THE INVENTION

1. Field of the Invention

The present invention relates to a semiconductor laser device used in optical communications, optical measurements and other types of optical information processing. More particularly, it relates to an edge-emitting periodic gain-type semiconductor laser device easily produced by using an MOCVD technique.

2. Description of the Prior Art

High reliability based on high monochromaticity and coherence of the emitted light is required in the optical communications and optical measurements fields. A distributed-feedback (DFB) semiconductor laser device in which periodic refractive index changes are formed in the current injection portion of the laser cavity oscillates laser light in a single longitudinal mode and the oscillation wavelength remains stable even if the temperature or driving current fluctuates.

FIG. 7 is a cross section taken in the direction of an optical waveguide of a prior art DFB laser device. An n-AlGaAs first cladding layer 602, a non-doped AlGaAs active layer 603, and a p-AlGaAs optical guiding layer 604 are grown in this order on an n-GaAs substrate 601. A diffraction grating 607 having a period nearly matching the wavelength of the laser light (inside the DFB laser device) is formed on the top surface of the p-AlGaAs optical guiding layer 604. A p-AlGaAs second cladding layer 605 and a p-GaAs contact layer 606 are successively grown on the p-AlGaAs optical guiding layer 604 on which the diffraction grating 607 has been formed. In this kind of DFB laser device, light having the wavelength matching the period of the diffraction grating 607 is selectively reflected by the diffraction grating 607 and amplified in the cavity.

FIG. 8A shows the relationship between the wavelength and the reflectance of the light generated in the DFB laser device, FIG. 8B shows the relationship between the wavelength and the waveguide gain of the light generated in the DFB laser device, and FIG. 8C shows the relationship between the wavelength and the device gain of the light generated in the DFB laser device.

In the DFB semiconductor layer device, a periodic diffraction distribution is formed in the current injection portion by the diffraction grating 607 as shown in FIG. 7, and therefore, as shown in FIG. 8A, light with a specific wavelength is selectively reflected. This results in a stable longitudinal mode oscillation. As shown in FIG. 8B, however, a clear wavelength selectivity is not demonstrated with respect to the waveguide gain, and therefore the device gain expressed as the product of the reflectance and the waveguide gain is broad as shown in FIG. 8C.

As a result, the device characteristics are easily perturbed and the oscillation wavelength fluctuates greatly in the DFB semiconductor laser device due to light generated in the cavity with differing phases caused by reflecting it off the end of the device or by return light with differing phases entering from the outside of the cavity. This large fluctuation in the wavelength is not desirable when used in the optical measurements field.

Further, a DFB laser device has equivalent reflectance peaks at two neighboring wavelengths as shown in FIG. 8A, which causes problems with oscillation in essentially two modes. In order to solve these problems of the DFB laser device, a semiconductor laser device having a periodic gain structure has been proposed. Here, we will explain the device proposed by Wei Hsin et al. at the 1987 International Electron Devices Meeting (No. 7, pp. 792-795) as one example.

FIG. 9 shows the structure of the prior art periodic gain-type semiconductor laser device. This kind of periodic gain-type semiconductor laser device is produced as described below. First, a semiconductor multilayer is formed by alternately growing $Al_{0.3}Ga_{0.7}As$ layers and GaAs layers on a semi-insulating GaAs substrate 801. The period with which the $Al_{0.3}Ga_{0.7}As$ layers and GaAs layers are alternately formed matches the half-wavelength of the emitted light. Following this, a stripe-shaped mesa multilayer active region 802 is formed by etching this semiconductor multilayer. Next, this multilayer active region 802 is buried by growing an $n-Al_{0.4}Ga_{0.6}As$ layer 804 on the substrate exposed by etching. A $p-Al_{0.4}Ga_{0.6}As$ region 805 is formed by diffusing zinc ions in the $n-Al_{0.4}Ga_{0.6}As$ layer 804 on one side of the multilayer active region 802. As a result, a pn junction is formed in the multilayer active region 802, and a surface-emitting periodic gain-type semiconductor laser device is obtained that emits light in the direction indicated by 806.

FIG. 10A shows the relationship between the wavelength and the reflectance of the light generated in a surface-emitting periodic gain-type laser device, FIG. 10B shows the relationship between the wavelength and the waveguide gain of the light generated in a surface-emitting periodic gain-type laser device, and FIG. 10C shows the relationship between the wavelength and the device gain of the light generated in a surface-emitting periodic gain-type laser device.

In this surface-emitting periodic gain-type semiconductor laser device, a periodic refractive index distribution is formed in the multilayer active region 802 by alternately growing $Al_{0.3}Ga_{0.7}As$ layers and GaAs layers, whereby light having a specific wavelength is selectively reflected as shown in FIG. 10A.

Recombinations between electrons and holes occur more easily in the GaAs layers than in the $Al_{0.3}Ga_{0.7}As$ layers in the multilayer active region 802. Therefore, gain is selectively supplied to light having the specific wavelength generated in the active region 802 to form a standing wave in which the maximum amplitude nodes thereof are at the center portion of each of the GaAs layers. As shown in FIG. 10B, this surface-emitting periodic gain-type semiconductor laser device has a steep wavelength selectivity with respect to the waveguide gain. As a result, the device gain, expressed as a product of the reflectance and the waveguide gain, shows a steep peak at a specific wavelength as shown in FIG. 10C.

Like a DFB semiconductor laser device, this surface-emitting periodic gain-type semiconductor laser device has equivalent reflectance peaks at two neighboring wavelengths as shown in FIG. 10A, so that it demonstrates equivalent reflectance peaks at two neighboring wavelengths. However, as shown in FIG. 10B, it demonstrates a peak at one wavelength with respect to the active layer gain, thus resulting in a single peak for the device gain as shown in FIG. 10C.

Since the optical waveguide region is formed by mesa etching in this surface-emitting periodic gain-type semiconductor laser device, it is difficult to form the optical waveguide region longer than 10 μm. When the optical waveguide region is short, the generated light is not stably amplified and emitted light with a stable wavelength cannot be obtained at a large amplification factor.

Further, in this surface-emitting periodic gain-type semiconductor laser device, since zinc ions are diffused from one side of the multilayer active region to form a pn junction in the multilayer active region, it is difficult to accurately position the end of the p-type region in the multilayer active region. Therefore, yield is adversely affected in the production of these devices.

SUMMARY OF THE INVENTION

The periodic gain-type semiconductor laser device for emitting light of this invention, which overcomes the above-discussed and numerous other disadvantages and deficiencies of the prior art, comprises a (100) semiconductor substrate of a first conductivity type; a mesa stripe formed in the [011] direction on said (100) semiconductor substrate, said mesa stripe having a top surface, said top surface including wide portions and narrow portions, said wide portions and narrow portions being arranged alternately with a period, said period being an integral multiple of the half-wavelength of the emitted light; and a multilayer structure formed on said mesa stripe, said multilayer structure including: a first cladding layer of the first conductivity type formed on said top surface of said mesa stripe; and an active layer formed on a top surface of said first cladding layer, said multilayer structure comprising first portions formed on said wide portions of said top surface of said mesa stripe and second portions formed on said narrow portions of said top surface of said mesa stripe.

In a preferred embodiment, each of said first portions has a trapezoidal cross section perpendicular to the [011] direction, and each of said second portions has a triangular cross section perpendicular to the [011] direction, and side faces of said multilayer structure being Δ111}B planes.

In a preferred embodiment, said device further comprises: a current confining means including a current confining layer, said current confining layer covering the sides of said active layer and having a top surface whose height is the same as the top surfaces of said first portions of said multilayer structure, and said means confining a driving current into said first portions of said multilayer structure; and a second cladding layer of a second conductivity type formed on said active layer and said current confining layer.

According to the invention, a periodic gaintype semiconductor laser device for emitting light is provided. The device comprises: a (100) semiconductor substrate of a first conductivity type; a mesa stripe formed in the [011] direction on said (100) semiconductor substrate, said mesa stripe having a top surface, said top surface including wide portions and narrow portions, said wide portions and narrow portions being arranged alternately with a period, said period being an integral multiple of the half-wavelength of the emitted light; a first cladding layer of a first conductivity type formed on said mesa stripe, said first cladding layer comprising first portions formed on said wide portions of said top surface of said mesa stripe and second portions formed on said narrow portions of said top surface of said mesa stripe, each of said first portions having a trapezoidal cross section perpendicular to the [011] direction, and each of said second portions having a triangular cross section perpendicular to the [011] direction, side faces of said multilayer structure being {111}B planes; and an active layer formed on top surfaces of said first portions of said first cladding layer.

In a preferred embodiment, the device further comprises a second cladding layer of a second conductivity type formed on said active layer and said first cladding layer.

Thus, the invention described herein makes possible the objective of providing a periodic gaintype semiconductor laser device that has good amplification characteristics and can be produced using a simple MOCVD method.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1A:
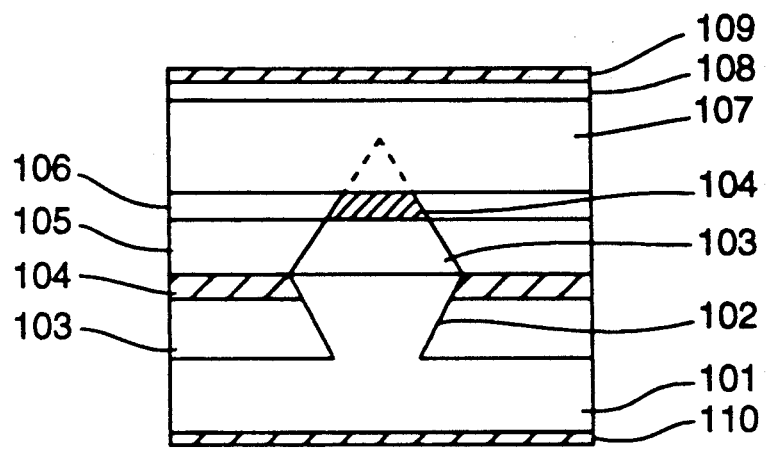
FIG. 1A is a cross section of a periodic gain-type semiconductor laser device according to the invention along line A—A in FIG. 2A.
Figure 1B:
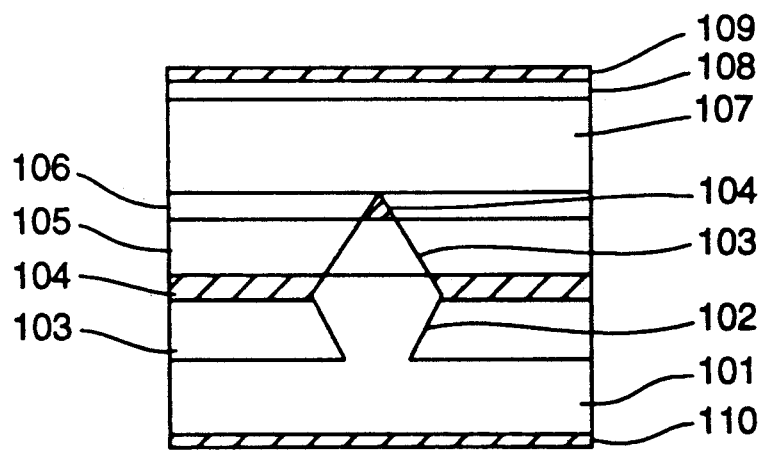
FIG. 1B is a cross section of the periodic gain-type semiconductor laser device along line B—B in FIG. 2A.

A first embodiment of a periodic gain-type semiconductor laser device according to the invention is shown in FIGS. 1A and 1B. The periodic gain-type semiconductor laser device is produced as described below.

Figure 2A:
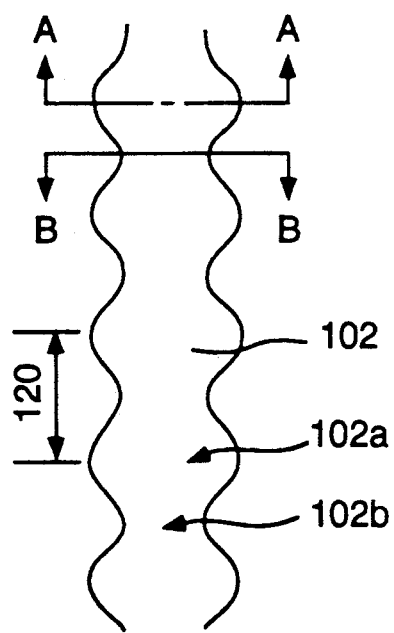
FIG. 2A is a plan view of the mesa stripe formed on the semiconductor substrate in the periodic gain-type semiconductor laser device according to the invention.

First, as shown in FIGS. 1A and 1B, a mesa stripe (height: approximately 1 μm) 102 is formed on a (100) n-GaAs substrate 101 by an electron beam exposure technique and a sulfuric acid wet etching technique using a silicon nitride dielectric film as an etching mask. The mesa stripe 102 has wide portions (2 μm wide) 102a and narrow portions (1 μm wide) 102b, as shown in FIG. 2A. The period 120 of the wide and narrow portions is 1.03 μm. This period is 9 times the half-wavelength (approximately 114 nm) of the laser light generated in the device. The direction of the mesa stripe 102 is nearly parallel to the [011] direction.

Figure 2B:
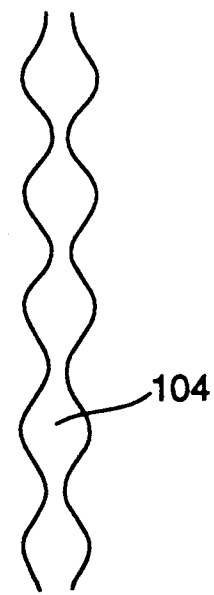
FIG. 2B is a plan view of the active layer of the periodic gain-type semiconductor laser device.

Referring back to FIGS. 1A and 1B, an n-AlGaAs first cladding layer 103 and an AlGaAs nondoped active layer 104 are grown on the top surface of the mesa stripe 102 by an MOCVD technique. A multilayer structure comprising the n-AlGaAs first cladding layer 103 and the AlGaAs non-doped active layer 104 is grown utilizing the growth rate dependence on the surface orientation. Thus, portions whose cross section is trapezoidal as shown in FIG. 1A and portions whose cross section is triangular as shown in FIG. 1B are alternately formed with the period 120 along the cavity length direction. A plan view of the AlGaAs non-doped active layer 104 is shown in FIG. 2B.

A p-AlGaAs second cladding layer 105 is grown on the top surface of the trapezoidal portion of the AlGaAs non-doped active layer 104, by utilizing the growth rate dependence on the surface orientation so that its cross section is triangular like that indicated by the dashed line in FIG. 1A.

Following this, an n-AlGaAs current confining layer 106 is grown under the condition that no growth occurs on the {111}B surface. In this process, since the n-AlGaAs current confining layer 106 is grown so that the height of its top surface matches the height of the top surface of the AlGaAs non-doped active layer 104, the portion of the AlGaAs non-doped active layer 104 whose cross section is triangular is buried by the n-AlGaAs current confining layer 106 as shown in FIG. 1B. Since a current is not injected into this portion buried by the n-AlGaAs current confining layer 106, it becomes a portion where the active layer does not substantially exist. In this way, portions where the active layer does not essentially exist are provided in the optical waveguide region having a period that is an integral multiple of the half-wavelength of the emitted light.

Following this, the p-AlGaAs second cladding layer 105 is grown again on the n-AlGaAs current confining layer 106, which buries the p-AlGaAs second cladding layer 105 that was just formed with a triangular cross section, and then a p-GaAs contact layer 108 is formed on top of this. The above growth processes are performed continuously. Finally, by forming an ohmic electrode 109 on the p-side and an ohmic electrode 110 on the n-side, the periodic gain-type semiconductor laser device is completed.

The periodic gain-type semiconductor laser device has a refractive index distribution corresponding to the wavelength of the emitted light, and is able to selectively supply gain to the maximum amplitude nodes of the standing wave of the light. Thus, the periodic gain-type semiconductor laser device is obtained by a simple process sequence using an MOCVD technique to perform a single epitaxial growth, and a high yield of 95% or more is obtained. Further, since this periodic gain-type semiconductor laser device is an edge emitting type laser in which the direction of light propagation is parallel to the top surface of the grown layers, it is possible to form optical waveguide paths of the required length by separating the wafer formed with the above device structure to the desired length.

The periodic gain-type semiconductor laser devices obtained in this manner emitted a laser beam with a wavelength of 800 nm. The stability of the wavelength of the emitted light and the stability of the longitudinal oscillation mode with respect to external return light were both superior to those of the DFB laser.

A second embodiment of a periodic gain-type semiconductor laser device according to the invention is shown in FIGS. 3A through 3D. The periodic gaintype semiconductor laser device is produced as described below.

Figure 3A:
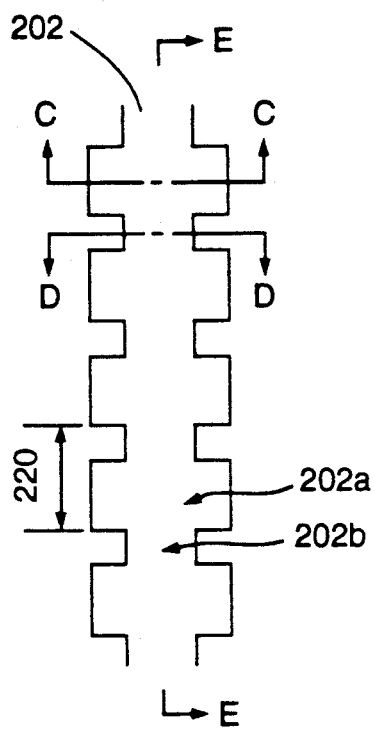
FIG. 3 is a plan view of the mesa stripe formed on the semiconductor substrate in another periodic gain-type semiconductor laser device according to the invention, FIG. 3B a cross section along line C—C of the periodic gain-type semiconductor laser device, FIG. 3C a cross section along line D—D of the periodic gain-type semiconductor laser device.
FIG. 3D is a cross section along line E—E of the periodic gain-type semiconductor laser device.
Figure 3B:
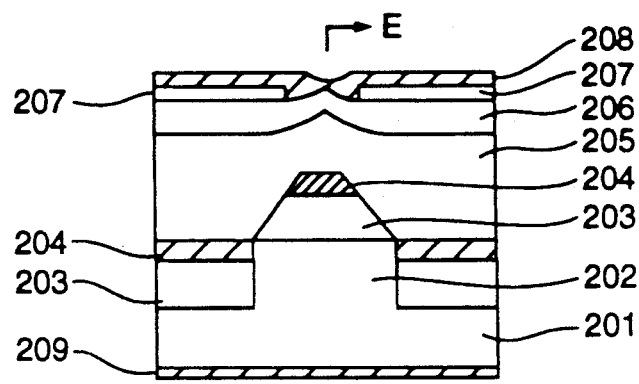
Figure 3C:
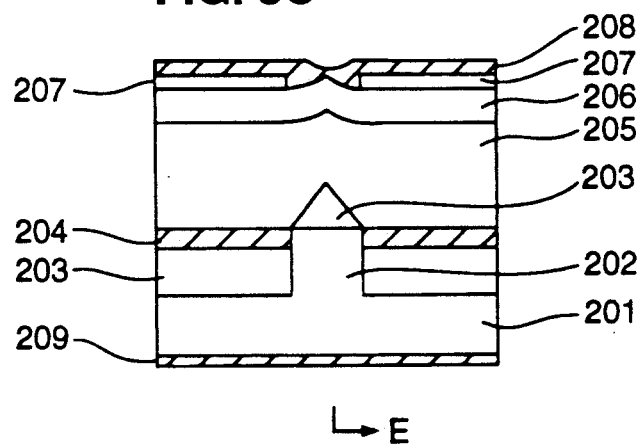

First, as shown in FIGS. 3B and 3C, a mesa stripe (height approximately 0.2 μm) 202 is formed on a (100) InP substrate 201 by an electron beam exposure technique and a reactive ion beam etching (RIE) technique. The mesa stripe 202 has wide portions (0.4 μm wide) 202a and narrow portions (0.2 μm wide) 202b, as shown in FIG. 3A. The period 220 of the wide portions 202a and the narrow portions 202b is 0.36 μm. It is two times the half-wavelength (approximately 180 nm of the laser light generated in the device). The direction of the mesa stripe 202 is nearly parallel to the [011] direction.

Figure 3D:
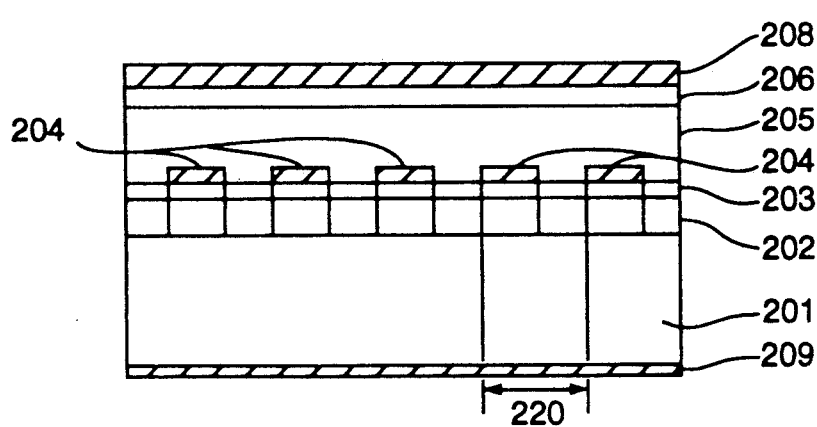

An n-InP first cladding layer (0.15 μm thick) 203 is grown on the top surface of the mesa stripe 202 by an MOCVD technique. Since the n-InP first cladding layer 203 is grown utilizing the growth rate dependence on the surface orientation, portions of the first cladding layer whose cross section is trapezoidal as shown in FIG. 3B and portions of the first cladding layer whose cross section is triangular as shown in FIG. 3C are alternately formed with the period 220. Next, an InGaAsP active layer (0.13 μm thick) 204 is grown on the n-InP first cladding layer 203. Since this crystal growth is performed under the condition that no growth occurs on the {111}B surface, the InGaAsP active layer 204 is formed on the top of the trapezoidal portion of the n-InP first cladding layer 203 and is not formed on the triangular portion of the n-InP first cladding layer 203. In this way, as shown in FIG. 3D, portions where the InGaAs active layer 204 does not exist are provided in the optical waveguide region with a period that is an integral multiple of the half-wavelength of the emitted light.

Following this, a p-InP second cladding layer (1.5 μm thick in flat portions) 205 is formed so that it buries the multilayer structure, and then a p-InGaAs contact layer (0.4 μm thick) 206 is formed on the p-InP second cladding layer 205. Also, an $SiO_2$ or $Si_3N_4$ dielectric film 207 is formed on the p-InGaAs contact layer 206 by a plasma CVD technique or an electron beam deposition technique, and then a stripe-shaped window (about 1.5 μm wide) is provided in the SiO₂ dielectric film 207 along the mesa stripe 202 by conventional lithography and etching techniques. Finally, by forming an ohmic electrode 208 on the p-side so that it buries this window and an ohmic electrode 209 on the n-side on the bottom surface of the InP substrate 201, the periodic gain-type semiconductor laser device is completed.

When InP is used as the substrate as in this embodiment, the InP substrate 201 is transparent to the oscillated light, and so it is possible to make the n-type first cladding layer 203 as thin as 0.2 μm. Therefore, the mesa stripe 202 can be made thinner than in an AlGaAs semiconductor laser device such as that in the first embodiment, and it becomes possible to reduce the width of the mesa stripe 202 and the period 220 to submicron dimensions. As a result, the period of the portions in which the active layer does not exist in the optical waveguide region becomes smaller. In this embodiment, this period is reduced to only two times the half-wavelength of the emitted light, and therefore a stable oscillation mode is achieved.

In this way, the periodic gain-type semiconductor laser device having the refractive index distribution corresponding to the emitted light wavelength in which gains are selectively supplied to the maximum amplitude nodes of the standing wave generated in the device is obtained with a high yield of 95% or better, by a simple process using an MOCVD technique.

Further, since this periodic gain-type semiconductor laser device is an edge emitting type in which the direction of light propagation is parallel to the surface of the grown layers, it is possible to form an optical waveguide path of the required length by separating the wafer into chips each having the desired length. Actually, devices were cut from the wafer so that the length in the direction of the mesa stripe 202 (in direction of optical waveguide) was 500 μm.

Figure 4:
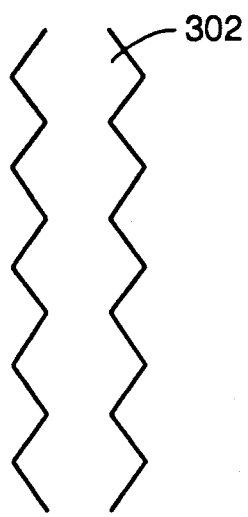
FIG. 4 is a plan view of an example of the of the mesa stripe formed on the semiconductor substrate in a periodic gain-type semiconductor laser device of the invention.
Figure 5:
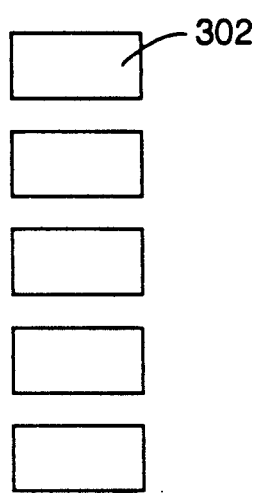
FIG. 5 is a plan view of an example of the shape of the mesa stripe formed on the semiconductor substrate in a periodic gain-type semiconductor laser device of the invention.
Figure 6:
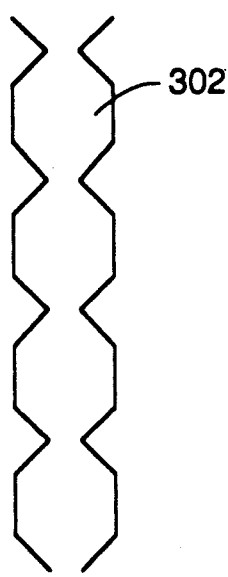
FIG. 6 is a plan view of an example of the shape of the mesa stripe formed on the semiconductor substrate in a periodic gain-type semiconductor laser device of the invention.
Figure 7:
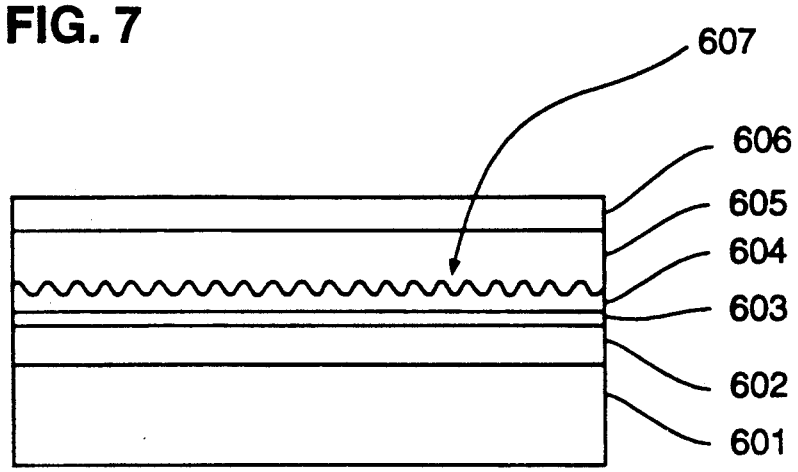
FIG. 7 is a cross section in the direction of the optical waveguide showing a prior art DFB laser device.
Figure 8A:
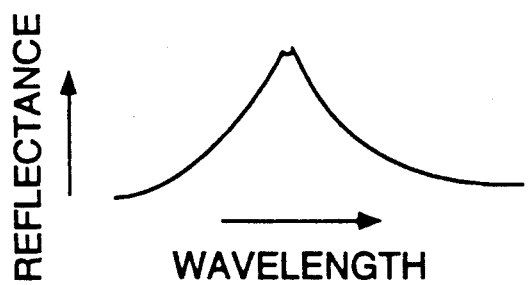
FIG. 8A is a graph showing the relationship between the wavelength and the reflectance of the light generated in the prior art DFB laser device.
Figure 8B:
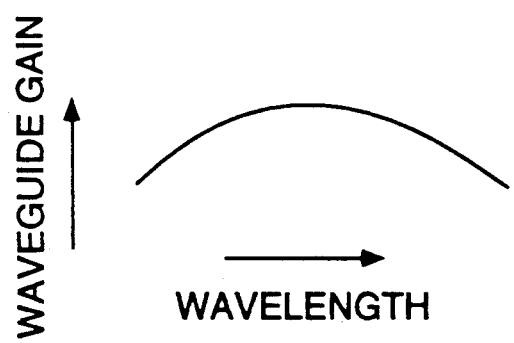
FIG. 8B is a graph showing the relationship between the wavelength and the waveguide gain of the light generated in the DFB laser device.
Figure 8C:
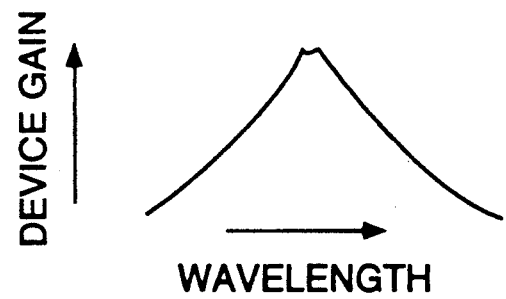
FIG. 8C is a graph showing the relationship between the wavelength and the device gain of the light generated in the DFB laser device.
Figure 9:
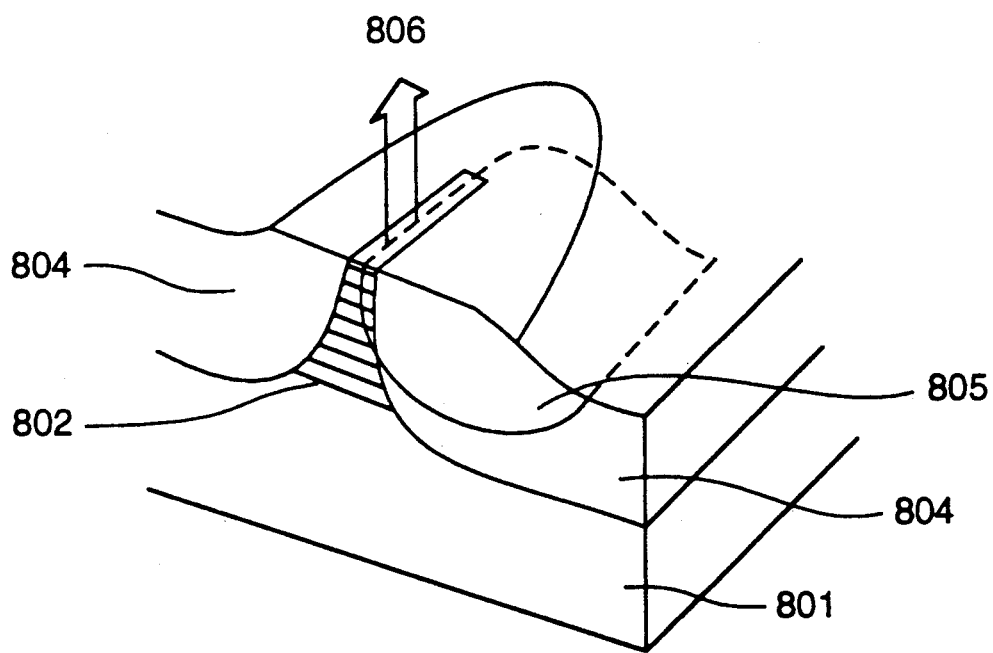
FIG. 9 is a perspective cross section showing the structure of a prior art periodic gain-type semiconductor laser device.
Figure 10A:
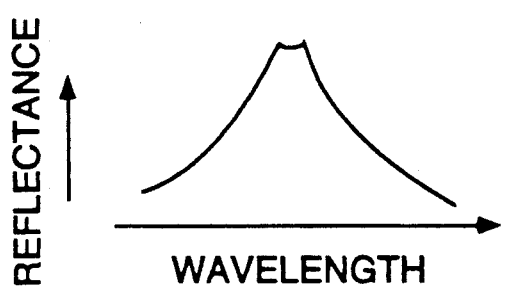
FIG. 10 is a graph showing the relationship between the wavelength and the reflectance of the light generated in a surface-emitting periodic gaintype laser device.
FIG. 10B is a graph showing the relationship between the wavelength and the waveguide gain of the light generated in the surface-emitting periodic gain-type laser device.
FIG. 10C is a graph showing the relationship between the wavelength the device gain of the light generated in the surface-emitting periodic gain-type laser device.
Figure 10B:
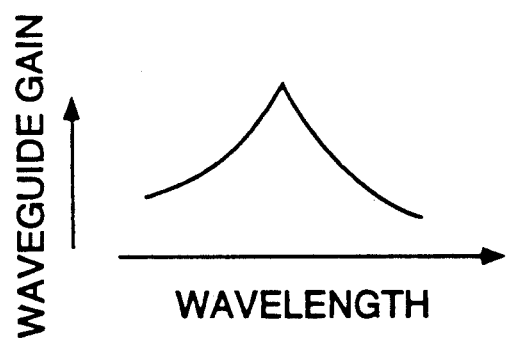
Figure 10C:
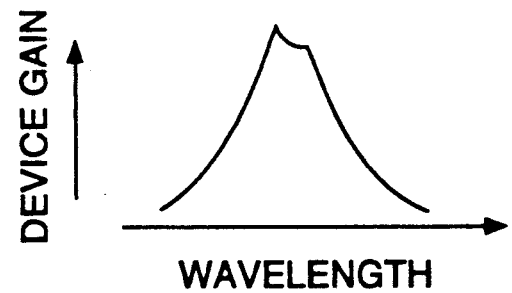

The mesa stripe shape need only periodically form portions where the active layer does not essentially exist in the optical waveguide region of the semiconductor laser device. For example, a mesa stripe 302 whose width increases and decreases in a sine wave shape or in a rectangular wave shape or with shapes like those in FIGS. 4, 5 and 6 can be used. The period with which the width of the mesa stripe increases and decreases is an integral multiple of the half-wavelength of the emitted light inside the device, and it is desirable that it be less than ten times greater and that it match the half-wavelength of the emitted light.

The periodic gain-type semiconductor laser devices obtained in this manner emitted a laser beam having a wavelength of 1.3 μm at a threshold current of 5-20 mA. The stability of the wavelength of the emitted light and the stability of the longitudinal oscillation mode with respect to external return light were both superior to those of the DFB laser.

Since the active layers in the two embodiments above are not directly etched, the condition of the heterointerface between the active layer and the other layer is good. Therefore, the life of the device is improved over that of the prior art periodic gaintype semiconductor laser devices.

According to the invention, it is possible to obtain an edge-emitting periodic gain-type semiconductor laser device with good amplification characteristics, having a refractive index distribution corresponding to the emitted light wavelength therein. The refractive index distribution can selectively supply gain to the maximum amplitude of the standing wave of the generated light. Moreover, it is possible to form an optical waveguide having the necessary length by a single crystal growth step using an MOCVD technique.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A periodic gain-type semiconductor laser device for emitting light, said device comprising:

a (100) semiconductor substrate of a first conductivity type;

a mesa stripe formed in the [011] direction on said (100) semiconductor substrate, said mesa stripe having a top surface, said top surface including wide portions and narrow portions, said wide portions and narrow portions being arranged alternately with a period, said period being an integral multiple of the half-wavelength of the emitted light; and a multilayer structure formed on said mesa stripe, said multilayer structure including: a first cladding layer of the first conductivity type formed on said top surface of said mesa stripe; and an active layer formed on a top surface of said first cladding layer, said multilayer structure comprising first portions formed on said wide portions of said top surface of said mesa stripe and second portions formed on said narrow portions of said top surface of said mesa stripe.

2. A periodic gain-type semiconductor laser device according to claim 1, wherein each of said first portions has a trapezoidal cross section perpendicular to the [011] direction, and each of said second portions has a triangular cross section perpendicular to the [011] direction, and side faces of said multilayer structure being {111}B planes.

3. A periodic gain-type semiconductor laser device according to claim 2, said device further comprising:

a current confining means including a current confining layer, said current confining layer covering the sides of said active layer and having a top surface whose height is the same as the top surfaces of said first portions of said multilayer structure, and said means confining a driving current into said first portions of said multilayer structure; and a second cladding layer of a second conductivity type formed on said active layer and said current confining layer.

4. A periodic gain-type semiconductor laser device for emitting light, comprising:

a (100) semiconductor substrate of a first conductivity type;

a mesa stripe formed in the [011] direction on said (100) semiconductor substrate, said mesa stripe having a top surface, said top surface including wide portions and narrow portions, said wide portions and narrow portions being arranged alternately with a period, said period being an integral multiple of the half-wavelength of the emitted light;

a first cladding layer of the first conductivity type formed on said mesa stripe, said first cladding layer comprising first portions formed on said wide portions of said top surface of said mesa stripe and second portions formed on said narrow portions of said top surface of said mesa stripe, each of said first portions having a trapezoidal cross section perpendicular to the [011] direction, and each of said second portions having a triangular cross section perpendicular to the [011] direction, side faces of said multilayer structure being {111}B planes; and an active layer formed on top surfaces of said first portions of said first cladding layer.

5. A periodic gain-type semiconductor layer device according to claim 4, said device further comprising:

a second cladding layer of a second conductivity type formed on said active layer and said first cladding layer.

* * * * *